(12) United States Patent
Messager

(10) Patent No.: US 7,138,854 B2
(45) Date of Patent: Nov. 21, 2006

(54) INTEGRATED CIRCUIT DELIVERING LOGIC LEVELS AT A VOLTAGE INDEPENDENT FROM THE MAINS VOLTAGE, WITH NO ATTACHED REGULATOR FOR THE POWER SECTION, AND CORRESPONDING COMMUNICATION MODULE

(75) Inventor: Philippe Messager, Nantes (FR)

(73) Assignee: Atmel Nantes S.A., Nantes Cedex 3 (FR)

( * ) Notice: Subject to any disclaimer, the term of this patent is extended or adjusted under 35 U.S.C. 154(b) by 0 days.

(21) Appl. No.: 10/814,811

(22) Filed: Mar. 31, 2004

(65) Prior Publication Data
US 2004/0239406 A1 Dec. 2, 2004

(30) Foreign Application Priority Data
Apr. 1, 2003 (FR) .................................. 03 04075

(51) Int. Cl.
*G05F 1/10* (2006.01)
(52) U.S. Cl. .................. 327/539; 327/540; 327/541; 327/542; 327/543
(58) Field of Classification Search ................ 327/538, 327/541, 542; 365/226, 189.07
See application file for complete search history.

(56) References Cited

U.S. PATENT DOCUMENTS

| | | | | |
|---|---|---|---|---|
| 5,187,631 A | * | 2/1993 | Baylac et al. | 361/94 |
| 5,689,460 A | * | 11/1997 | Ooishi | 365/189.07 |
| 5,767,550 A | * | 6/1998 | Calafut et al. | 257/355 |
| 5,812,021 A | * | 9/1998 | Ikeda | 327/541 |
| 5,886,565 A | * | 3/1999 | Yasui et al. | 327/530 |
| 5,990,671 A | * | 11/1999 | Nagata | 323/313 |
| 6,100,754 A | | 8/2000 | Kim et al. | 327/541 |
| 6,169,698 B1 | * | 1/2001 | Sukegawa et al. | 365/226 |
| 6,486,731 B1 | * | 11/2002 | Yamasaki et al. | 327/541 |
| 6,518,835 B1 | * | 2/2003 | Riho et al. | 327/565 |
| 6,650,175 B1 | * | 11/2003 | Messager | 327/541 |
| 6,784,702 B1 | * | 8/2004 | Chen | 327/110 |
| 6,809,578 B1 | * | 10/2004 | Saitoh | 327/541 |
| 6,847,231 B1 | * | 1/2005 | Kinugawa et al. | 326/82 |
| 2005/0169040 A1 | * | 8/2005 | Peng et al. | 365/149 |

FOREIGN PATENT DOCUMENTS

| | | |
|---|---|---|
| JP | 5 136681 | 6/1993 |
| JP | 7 022939 | 1/1995 |
| JP | 2000 194432 | 7/2000 |

* cited by examiner

Primary Examiner—Tuan T. Lam
Assistant Examiner—Hiep Nguyen
(74) Attorney, Agent, or Firm—Westman, Champlin & Kelly

(57) ABSTRACT

The invention concerns an integrated circuit comprising means of delivering, on at least one output, a predetermined output voltage representative of a logic level, means of distributing a mains voltage and means of generating an internal voltage reference lower than the mains voltage, comprising means of connecting the mains voltage to the output and means of limiting and/or detecting the voltage at the output at the predetermined output voltage value, taking into account the reference voltage.

14 Claims, 5 Drawing Sheets

INTEGRATED CIRCUIT DELIVERING LOGIC LEVELS AT A VOLTAGE INDEPENDENT FROM THE MAINS VOLTAGE, WITH NO ATTACHED REGULATOR FOR THE POWER SECTION, AND CORRESPONDING COMMUNICATION MODULE

FIELD OF THE INVENTION

The field of the invention is that of the design and manufacture of integrated circuits, e.g. of MOS type.

More specifically, the invention concerns the circuits delivering logic levels, whose voltage must remain constant even when the mains voltage varies.

BACKGROUND OF THE INVENTION

The invention concerns, in particular, the communication between two integrated circuits, e.g. via a USB connection. A USB buffer must in fact provide logic actions "1" and "0" at output, on a connection which can reach an output of 500 pF of capacitance, with a switching time of approximately 20 ns. The USB standard specifies that level "1" must have a voltage of 3V, whatever the mains voltage may be.

Normally, a USB buffer is just a power switch and is powered by a regulator delivering a constant 3V. This regulator must therefore have a very large output capacitor 15, in order to be able to support the peaks in current, in the region of 100 mA for 20 ns. In fact, it would not be able to react in 20 ns (as illustrated in FIG. 2) without this capacitor, and the voltage would then drop greatly without the latter.

FIG. 1 illustrates such a device. It therefore comprises a regulator 11, comprising an operational amplifier 111, which receives a Vbgap reference voltage on its positive terminal, for example, of 1.2 V. This operational amplifier 111 is connected to a transistor 112, this latter looping back to the negative input of the former, via a resistor 113. This regulator therefore delivers a DC voltage of 3 V to be regulated, with the aid of the external capacitor 14, which is directed in particular towards the buffer 12.

This buffer comprises two transistors 121 and 122, PMOS and NMOS respectively, which receive a command signal 123, and deliver on a resistor 124 the invention corresponding to the desired logic level.

As mentioned above, in order to obtain a response time below 20 ns, it is necessary to provide for an external capacitor 13, of a value of 500 pF for example. This necessitates providing for a specific output terminal on the integrated circuit, in order to connect this external capacitor 13.

Furthermore, such a capacitor increases the cost of the assembly, as well as the space required and the complexity of assembly.

Moreover, a regulator, assuming the presence of an operational amplifier, leads to a significant crowding of the surface of the integrated circuit.

The objective of the invention is in particular to reduce these various difficulties with the state of the art.

More specifically, one objective of the invention is to produce an integrated circuit capable of delivering a predetermined output voltage representative of a logic level, whatever the mains voltage, which does not require any external component, particularly a capacitor, to support peaks in current.

Another objective of the invention is to produce such an integrated circuit, which does not require the presence of a standard USB regulator, assuming the presence of an operational amplifier.

Another objective of the invention is to produce such an integrated circuit, which allows for simplifying the design, manufacture and assembly of the integrated circuit.

In other words, one objective of the invention is to provide a simple and efficient technique which uses little of the silicon surface, to produce such an integrated circuit.

The objective of the invention is also to produce such an integrated circuit, which offers a very short rise time up to the desired voltage, e.g. in the region of 20 ns.

SUMMARY OF THE INVENTION

The invention therefore concerns an integrated circuit comprising means of delivering a predetermined output voltage representative of a logic level to at least one output, the integrated circuit comprising means of distributing a mains voltage and means of generating an internal reference voltage lower than the mains voltage.

Such a circuit comprises, in particular, means to connect the mains voltage to the output and means to limit and/or detect the voltage at the output at the value of the predetermined output voltage, taking into account the reference voltage.

In this way, it is possible to obtain an accurate output voltage, whatever the variations in the mains voltage, without an external element such as a capacitor.

Advantageously, the predetermined voltage is equal to the reference voltage.

However, in another embodiment of the invention, it is possible to generate an output voltage which is different from the reference voltage, while ensuring the same functionalities, by using for example, one or more transistors connected in series.

It is preferential that when the predetermined voltage is reached, the currents circulating in the mains voltage connection means and in the means of limiting and/or detecting the voltage are balanced.

It is preferential that the connection means comprise a first power transistor (TP0).

One benefit is that the drain from the first transistor is connected to the output and its source to the mains voltage.

One benefit is that the means of limiting the voltage have at least a second transistor (TP1) controlled on its gate by the reference voltage.

It is preferential that the gate of the second transistor is connected to the gate of a third transistor (TP2) mounted in the diode at the reference voltage.

It is preferential that the means of limiting the voltage comprise means to block the first transistor when the predetermined voltage is reached.

It is also preferential that the blocking means comprise first and second current mirrors (TN1/TN2, TP4/TP5) connected to each other.

One benefit is that the first current mirror delivers a blocking current when the predetermined voltage is reached at the output, and in that the second mirror transmits a copy of the blocking current to the gate of the first transistor, in such a way as to block it.

One benefit is that the gate of the first transistor is connected to a control input via a fourth transistor (TN3).

Another benefit also is the size of the third transistor is smaller than those of the transistors (TP4, TP5) of the second mirror, so that the latter imposes its level on the third transistor when it delivers the copy of the blocking current.

It is preferential that the output voltage corresponds to the logic level "1" of a USB connection.

One benefit is that the reference voltage is used to control the CMOS logic section of the integrated circuit.

One benefit is that the reference voltage and/or the predetermined voltage give a value of 3 V, the mains voltage giving a value of 5 V.

The invention also concerns an integrated circuit communication module comprising means of delivering, on at least one output, a predetermined output voltage representative of a logic level and an integrated circuit comprising means of distributing a mains voltage and means of generating an internal reference voltage lower than the mains voltage. One benefit is that this module comprises means of connecting the mains voltage to the output and means of limiting voltage at the output at the predetermined output voltage value, taking into account the reference voltage.

BRIEF DESCRIPTION OF THE DRAWINGS

Other characteristics and advantages of the invention will be shown more clearly upon reading the following description of a preferred embodiment of the invention, given as a simple but not limiting illustrative example and some attached diagrams, among which.

DETAILED DESCRIPTION OF THE PREFERRED EMBODIMENTS

The general principle of the invention consists in generating the 3 V voltage in the integrated circuit, without the need for a regulator for the power section. In general, there is in fact a regulator in the circuits for the CMOS logic section, so that it always operates at a low voltage (3 V and not 5.5 V, to avoid the risk of destroying small transistors).

Figure 1:
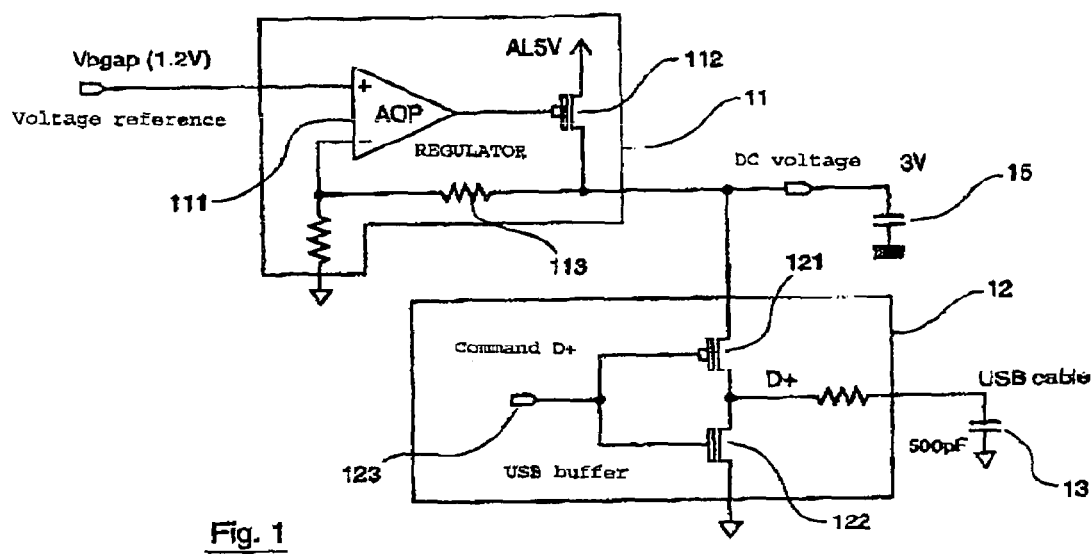
FIG. 1 is a diagram illustrating a regulating device according to the prior art with an external capacitor, referred to in the preamble.
Figure 2:
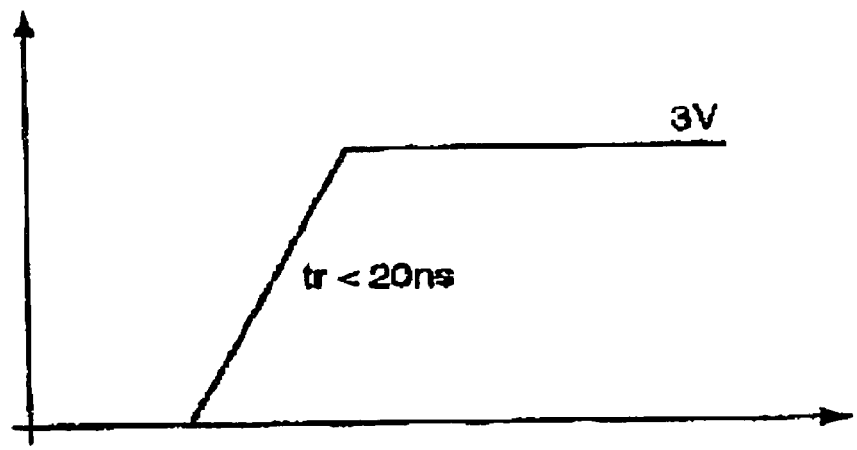
FIG. 2 illustrates the voltage of the output signal, according to both the prior art and the invention.
Figure 3:
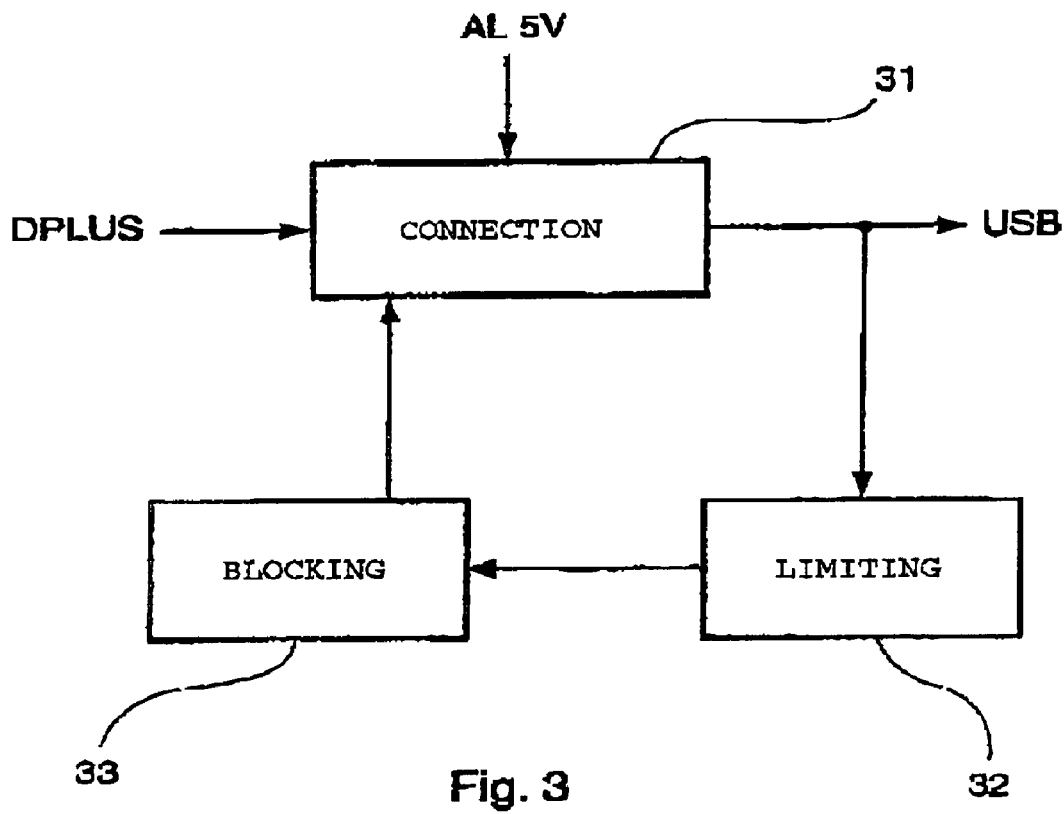
FIG. 3 is a schematic diagram of the technique according to the invention.

One beneficial aspect of the invention is that this 3 V voltage thus serves as the reference to generate a logic level "1", according to the USB standard (in the embodiment described), by taking the power directly from the 5 V supply. FIG. 3 illustrates the general principle of the invention in a simplified way.

The system of the invention therefore includes means of connecting 31 the 5 V supply at the USB output. These connection means include, notably, a PMOS transistor, which connects the 5 V supply to the USB output.

Means of limiting 32 the voltage delivered to this USB output are provided for. They are connected to this output in such a way as to absorb part of the voltage, when necessary, so that it does not exceed 3 V.

These limiting means 32 simultaneously control the blocking means 33, comprising, for example, two current mirrors. They act on the connection means in such a way as to block the connection between the 5 V supply and the USB output.

So, it is possible to deliver a USB output at a regular 3 V voltage, without an external capacitor or an operational amplifier, or any other complex element.

Presentation of a Particular Method of Carrying Out the Invention

Figure 4:
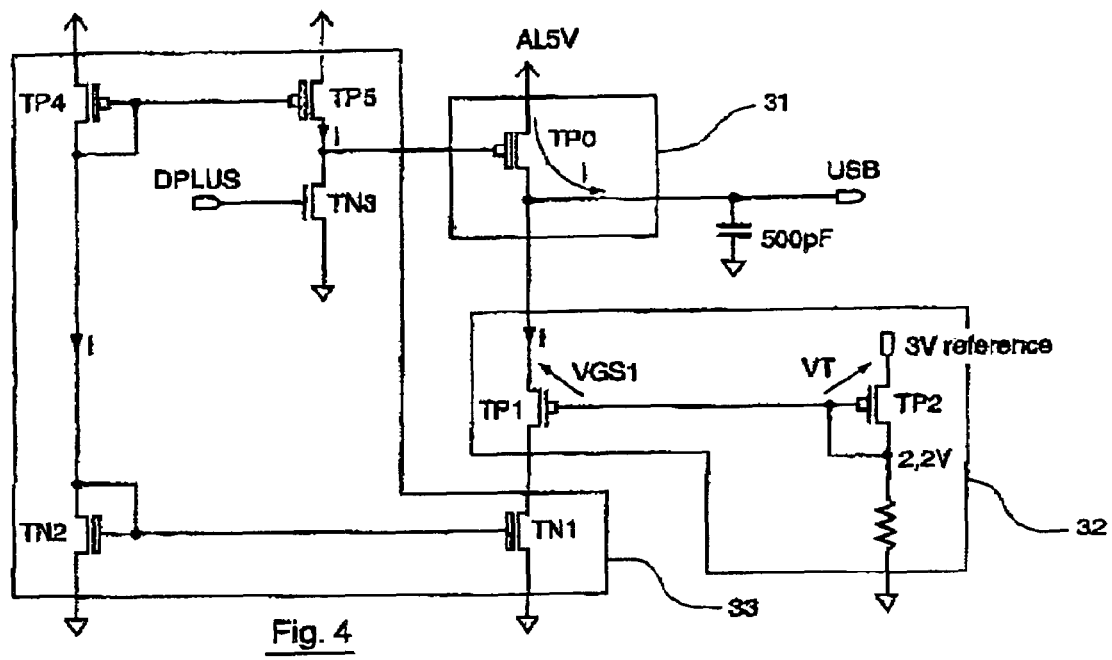
FIG. 4 is a detailed example of implementing the technique according to the invention.
Figure 5A:
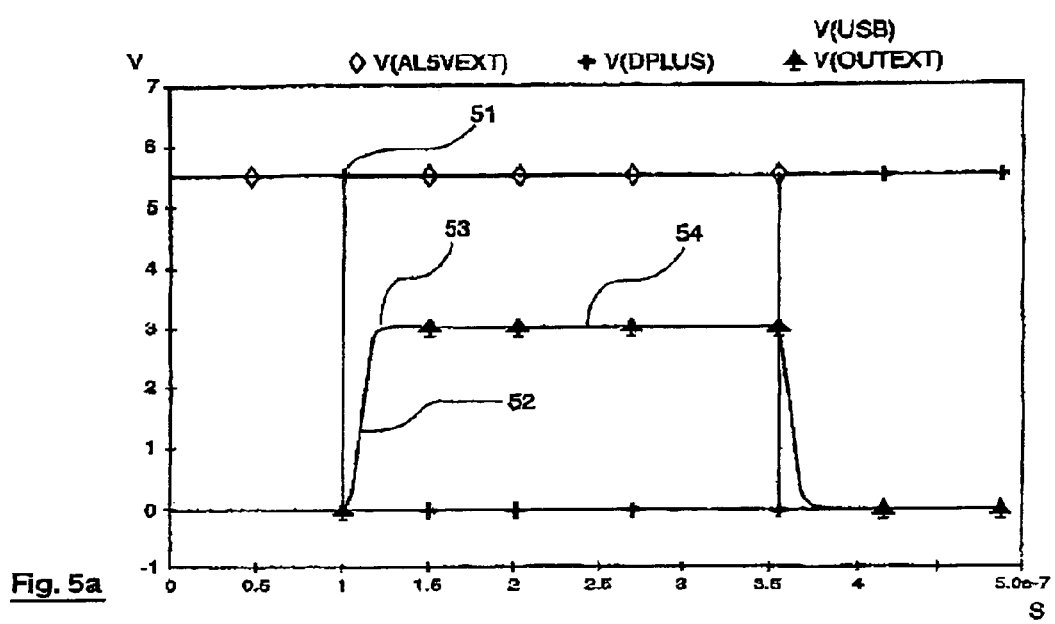
FIGS. 5.*a* and 5.*b* illustrate value curves associated with the functioning of the device in FIG. 4.
Figure 5B:
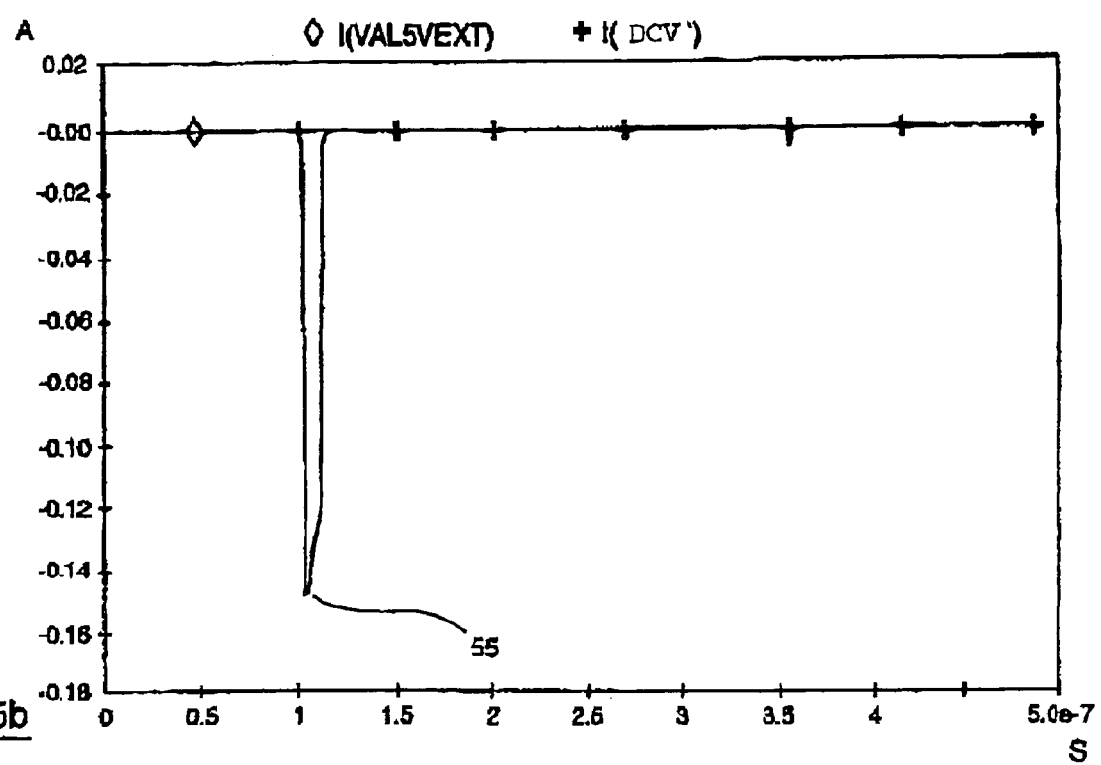

A particular example is now presented for implementing these techniques, with the help of FIG. 4, which shows a particular method of embodiment of the invention and FIG. 5(*a* and *b*) which illustrates some operational values.

The transistor TP0 (PMOS in this example, but it is of course possible to reverse the roles of the PMOS and NMOS transistors) connects the 5 V supply AL5V to the USB output. It becomes active depending on the signal it receives at its gate, controlled as explained later.

According to the invention, the transistor TP1 (PMOS) is connected to the USB output by its drain. Its gate is connected at a VT voltage lower than the USB voltage (and with a value, for example, of approximately 2.2 V).

This VT voltage can be produced using a transistor TP2 of the same type as TP1, connected to diodes with a 3 V numeric voltage (always available in the CMOS logic section of an integrated circuit). This transistor therefore generates a voltage equal to (3 V−VT). This transistor TP1 thus has a function of instant detector of level "1" (3 V) on the USB output. In fact, as soon as the voltage at the USB output exceeds 3 V, the voltage VGS1 of this transistor TP1 becomes greater than VT (with a value of approximately 0.8 V) and therefore becomes active.

A current i passes through this transistor TP1. Due to this current i, the power transistor TP0 can be closed, using the blocking means, which connect the USB output to the 5 V supply. It is therefore easy to limit the level "1" of the USB to 3 V.

A simple comparator comparing the USB output with the numeric 3 V voltage, to then close the power transistor TP0, would be too slow, and would create overshoots and would also consume much. The solution, according to the invention, uses current mirrors in the blocking means and allows for efficiently reducing this disadvantage.

It should be noted that the principle described above also works with NMOS transistors in place of the PMOS, TP0 and TP1 transistors.

Illustration of the Functioning of the Device in FIG. 4

When a level "1" is wanted at the USB output, the command DPLUS changes to "1" (51, FIG. 5.*a*). The transistor TN3 then opens the power transistor TP0, by applying a VSS voltage to its gate. The voltage at the USB output then progressively rises (52, FIG. 5.*a*). When it reaches 3 V, after about 20 ns (53, FIG. 5.*a*), the transistor TP1 becomes slightly conducting, as its VGS1 voltage has become greater than the VT voltage. The current coming from the transistor TP0 to the transistor TP1 is then instantly re-copied by the current mirror formed by the transistors TN1 and TN2, then by the current mirror formed by the transistors TP4/TP5.

So, when a current circulates in TP1, there is a similar current circulating in TP5. This current allows for closing the transistor TP0, by resetting its gate voltage to 5V−VT, which leads to its closure, at least partially.

The transistor TP5 is configured in such a way that it is able to impose its level on transistor TN3, the latter being a very weak transistor.

So, the system charges the USB capacity up to 3 V, and then maintains this level (54, FIG. 5.*a*), by balancing the currents, in the region of a few dozen pA in the transistors TP0 and TP1. All the power to charge the 500 pF of the USB thus comes directly from the mains voltage AL5V (55, FIG. 5.*b*). There is therefore no need for a USB regulator or external capacitor in the solution according to the invention.

Applications

The device of the invention can be installed whenever external capacitors need to be reduced to a minimum, e.g. for USB connections. It applies particularly in the case where the integrated circuit has an internal voltage reference has the same value as the voltage to be output, via buffers.

General

In one particular embodiment of the invention, one or more other transistors are used in series with the transistor TP2, or even a low-power regulator (e.g. 1.2 V), so as to generate a USB output voltage (e.g. of 2 V) which is different from the reference voltage, while ensuring the same functionalities.

Although the present invention has been described with reference to preferred embodiments, workers skilled in the art will recognize that changes may be made in form and detail without departing from the spirit and scope of the invention.

What is claimed is:

1. Integrated circuit comprising means of delivering to at least one output a predetermined output voltage representative of a logic level, which comprises means of generating a main voltage and means of generating a reference voltage lower than the main voltage, characterized in that it comprises
   a first transistor connecting the main voltage on the output, and
   means of limiting and/or detecting the voltage on the output at the value of the predetermined output voltage, equal to the reference voltage, and which comprises at least a second transistor having a gate connected to the gate of a third transistor mounted as a diode at the reference voltage, the limiting means comprising means of blocking the first transistor when the predetermined voltage is reached, and the blocking means having first and second mirrors connected to each other.

2. Integrated circuit according to claim 1, characterized in that, when the predetermined voltage is reached, the currents circulating in the first transistor and in the limiting and/or detecting means are comprised in the region of a few dozen µA.

3. Integrated circuit according to claim 1, characterized in that the first transistor comprises a first power transistor.

4. Integrated circuit according to claim 3, characterized in that the drain of the first power transistor is connected to the output and its source to the main voltage.

5. Integrated circuit according to claim 1, characterized in that the first current mirror delivers a blocking current when the predetermined voltage is reached on the output, and in that the second mirror sends a copy of the blocking current to the gate of the first power transistor, so as to block it.

6. Integrated circuit according to claim 3, characterized in that the gate of the first power transistor is connected to a command input via a fourth transistor.

7. Integrated circuit according to claim 6, characterized in that the fourth transistor is weaker than the transistors of the second mirror, so that the latter imposes its level on the fourth transistor when it delivers the copy of the blocking current.

8. Integrated circuit according to claim 1, characterized in that the output voltage corresponds to the logic level "1" of a USB connection.

9. Integrated circuit according to claim 1, characterized in that the reference voltage is used to supply the logic CMOS section of the integrated circuit.

10. Integrated circuit according to claim 1, characterized in that the reference voltage and/or the predetermined voltage have the value of 3 V, the main voltage having a value of 5 V.

11. Communication module for an integrated circuit comprising means of delivering, on at least one output, a predetermined output voltage representative of a logic level, which comprise means of generating a main voltage and means of generating a reference voltage lower than the main voltage, characterized in that it comprises
   a first transistor connecting the main voltage to the output, and
   means of limiting the voltage on the output at the predetermined output voltage value, which comprises at least a second transistor having a gate connected to the gate of a third transistor mounted as a diode at the reference voltage, the limiting means comprising means of blocking the first transistor when the predetermined voltage is reached, and the blocking means having first and second mirrors connected to each other.

12. Integrated circuit comprising means of delivering to at least one output a predetermined output voltage representative of a logic level, which comprise means of generating a main voltage and means of generating a reference voltage lower than the main voltage, characterized in that it comprises
   means of connecting the main voltage on the output, which comprise a first power transistor, and
   means of limiting and/or detecting the voltage on the output at the value of the predetermined output voltage, taking into account the reference voltage,
   the limiting means comprising means of blocking the first power transistor when the predetermined voltage is reached,
   the blocking means have first and second current mirrors connected to each other,
   the first current mirror delivers a blocking current when the predetermined voltage is reached on the output, and in that the second mirror sends a copy of the blocking current to the gate of the first power transistor so as to block it,
   the gate of the first power transistor being connected to a command input via a fourth transistor,
   the fourth transistor is weaker than the transistors of the second mirror, so that the later imposes its level on the fourth transistor when it delivers the copy of the blocking current.

13. Integrated circuit comprising means of delivering to at least one output a predetermined output voltage representative of a logic level, which comprises means of generating a main voltage and means of generating a reference voltage lower than the main voltage, and comprising:
   means of connecting the main voltage on the output and comprising a first power transistor, and
   means of limiting and/or detecting the voltage on the output at the value of the predetermined output voltage, equal to the reference voltage, and comprising means of blocking the first power transistor when the predetermined voltage is reached, the means of blocking comprising first and second current mirrors connected to each other.

14. Integrated circuit comprising means of delivering to at least one output a predetermined output voltage representative of a logic level, which comprises means of generating a main voltage and means of generating a reference voltage lower than the main voltage, and comprising:

means of connecting the main voltage on the output, and means of limiting and/or detecting the voltage on the output at the value of the predetermined output voltage, equal to the reference voltage, and which comprises means of blocking the means of connecting when the predetermined voltage is reached, wherein the means of blocking comprises a first current mirror that delivers a blocking current when the predetermined voltage is reached on the output and a second current mirror that sends a copy of the blocking current to the means of connecting, so as to block the means of connecting.

* * * * *